United States Patent [19]

Conway, Jr.

[11] Patent Number: 5,733,468
[45] Date of Patent: Mar. 31, 1998

[54] PATTERN PLATING METHOD FOR FABRICATING PRINTED CIRCUIT BOARDS

[76] Inventor: John W. Conway, Jr., 12913 N. 66th St., Longmont, Colo. 80503

[21] Appl. No.: 703,849

[22] Filed: Aug. 27, 1996

[51] Int. Cl.$^6$ ............................. H05K 3/00; H05K 3/06
[52] U.S. Cl. ................. 216/21; 216/105; 438/689; 438/694; 438/703
[58] Field of Search ............................. 438/689, 694, 438/703; 216/21, 105

[56] References Cited

U.S. PATENT DOCUMENTS

| | | | |
|---|---|---|---|
| 3,990,926 | 11/1976 | Konicek | 156/3 |
| 5,209,817 | 5/1993 | Ahmad et al. | 156/643 |
| 5,218,761 | 6/1993 | Maniwa et al. | 29/852 |
| 5,246,732 | 9/1993 | van der Putten | 427/96 |
| 5,262,247 | 11/1993 | Kajiwara et al. | 428/607 |

Primary Examiner—John Kight
Assistant Examiner—Everett White
Attorney, Agent, or Firm—Dorr, Carson, Sloan & Birney, P.C.

[57] ABSTRACT

A pattern plating method for fabricating printed circuit boards begins by bonding a thin layer of copper (e.g., copper foil) to the surface of the board. A photoresist layer is laminated over the copper layer, and then selectively exposed and developed to define a desired pattern of traces. A thick, second layer of copper is deposited on the traces by electrolytic deposition, and the photoresist is then removed. The board is etched with a solution containing cupric chloride (or an ammoniacal etchant) to remove those portions of the first copper layer that are not covered by the second copper layer. The present invention also allows through-holes to be drilled at selected locations after the first layer of copper foil has been bonded to the board. A thin layer of copper is then deposited by electroless deposition to create a conductive surface in the through-holes necessary for the subsequent step of electrolytic deposition in the process above.

17 Claims, 3 Drawing Sheets

PATTERN PLATING METHOD FOR FABRICATING PRINTED CIRCUIT BOARDS

BACKGROUND OF THE INVENTION

1. Field of the Invention

The present invention relates generally to the field of printed circuit board fabrication. More specifically, the present invention discloses a pattern plating method for fabricating printed circuit boards.

2. Statement of the Problem

A variety of pattern plating methods have been used in the past to make printed circuit boards. The conventional approach that is most widely used in the industry starts with a board having a relatively thick layer of copper laminate (e.g., ½ to 1 oz. per square foot). If necessary, holes are drilled through the board and a thin layer of copper is deposited using electroless plating. A layer of photoresist material is deposited on the copper laminate to define a desired pattern of traces. Copper traces are deposited on the exposed portions of the copper laminate by electroplating. In the conventional process, a layer of tin or solder is deposited on top of the copper traces, and an etchant is then used to remove the exposed portions of the copper. The photoresist layer is then stripped.

This conventional approach has several shortcomings. The etchant must remove an unnecessary large amount of copper, which increases manufacturing costs and waste treatment costs. Conventional etching solutions also create environmental pollution concerns. Finally, the etching process tends to undercut the traces.

The prior art also includes the following patents relating to processes for manufacturing printed circuit boards:

| Inventor | Patent No. | Issue Date |
| --- | --- | --- |
| Kajiwara et al. | 5,262,247 | Nov. 16, 1993 |
| van der Putten | 5,246,732 | Sep. 21, 1993 |
| Maniwa et al. | 5,218,761 | June 15, 1993 |
| Ahmad et al. | 5,209,817 | May 11, 1993 |
| Konicek | 3,990,926 | Nov. 9, 1976 |

Kajiwara et al. disclose a thin copper foil for printed circuit boards having a multi-layer structure.

Van der Putten discloses a method for electroless deposition of copper on a dielectric substrate to form a conductor pattern. A $SiO_2$ layer is applied to the substrate. A thin metal pattern (e.g., TiW) is created on the $SiO_2$ layer. Anchors are formed on the surface by subjecting the $SiO_2$ layer to an under-etch treatment. Electroless copper grows around these anchors and thereby adheres to the substrate.

Maniwa et al. disclose a process for manufacturing printed circuit boards. FIGS. 1A through 1H show the process for plating a through hole 6. A thin copper plating layer 7 is formed on the surfaces of the board (including the walls of any through holes 6) by electroless plating as shown in FIG. 1C. An alkali-soluble photoresist film 8 is selectively applied over the thin copper plating layer (FIG. 1D) and a thick copper plating layer 9 is then deposited on the exposed portions of the thin copper plating layer (FIG. 1E). The photoresist 8 is stripped (FIG. 1F) using a sodium hydroxide solution, and those portions of the thin copper plating layer 7 that are not masked by the thick copper plating layer 9 are etched away (FIG. 1G) using an etching solution that is a mixture of sulfuric acid and hydrogen peroxide. Maniwa et al. discuss this process primarily in the context of plating through holes. However, the patent also mentions that this process can be employed to create wiring traces on the board.

Ahmad et al. disclose a selective plating method for forming conductive traces and vias on multi-level wiring structures (e.g., printed circuit boards) by isotropic deposition of a conductive material (e.g., copper) on a dielectric base.

Konicek discloses a method for the production of a material for printed circuit boards in which a temporary base is coated by electroplating with a thin, unpatterned metallic layer. Next, the free surface of the metallic layer is bonded to a final base. The temporary base is then removed and the desired wiring pattern is produced by etching the metallic layer on the final base.

3. Solution to the Problem

None of the prior art references uncovered in the search show a method for fabricating printed circuit boards in accordance with the sequence of steps in the present invention. In particular, the present invention eliminates many of the shortcomings associated with conventional pattern plating processes for printed circuit boards. For example, the thinness of the initial layer of copper (e.g., copper foil) greatly reduces the amount of etching required, and in turn reduces manufacturing costs and environmental concerns. The need to overplate traces with a dissimilar metal (e.g., tin, tin-lead, or nickel-gold) as an intermediate step prior to etching is completely eliminated. In addition, the present process employs a cupric chloride solution as the etchant, which is less expensive than conventional etchants and can be easily refortified for reuse to reduce the environmental impact. An ammoniacal etchant could also be used.

SUMMARY OF THE INVENTION

This invention provides a pattern plating method for fabricating printed circuit boards beginning with a thin layer of copper (e.g., copper foil) bonded to the surface of the board. A photoresist layer is laminated over the copper layer, and then selectively exposed and developed to define a desired pattern of traces. A thick, second layer of copper is deposited on the traces by electrolytic deposition, and the photoresist is then removed. The board is etched with a solution containing cupric chloride (or an ammoniacal etchant) to remove those portions of the first copper layer that are not covered by the second copper layer. The present invention also allows through-holes to be drilled at selected locations after the first layer of copper foil has been bonded to the board. A thin layer of copper is then deposited by electroless deposition to provide a conductive surface in the through-holes necessary for the subsequent step of electrolytic deposition in the process above.

A primary object of the present invention is to provide a method for fabricating printed circuit boards that substantially reduces manufacturing costs.

Another object of the present invention is to provide a method for fabricating printed circuit boards that reduces waste and environmental hazards associated with conventional pattern plating techniques by eliminating the intermediate step of overplating traces with a dissimilar metal (e.g., tin, tin-lead, or nickel-gold).

Yet another object of the present invention is to provide a method for fabricating printed circuit boards that can use an etching solution that is less expensive, and that can be refortified and reused to minimize environmental concerns.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
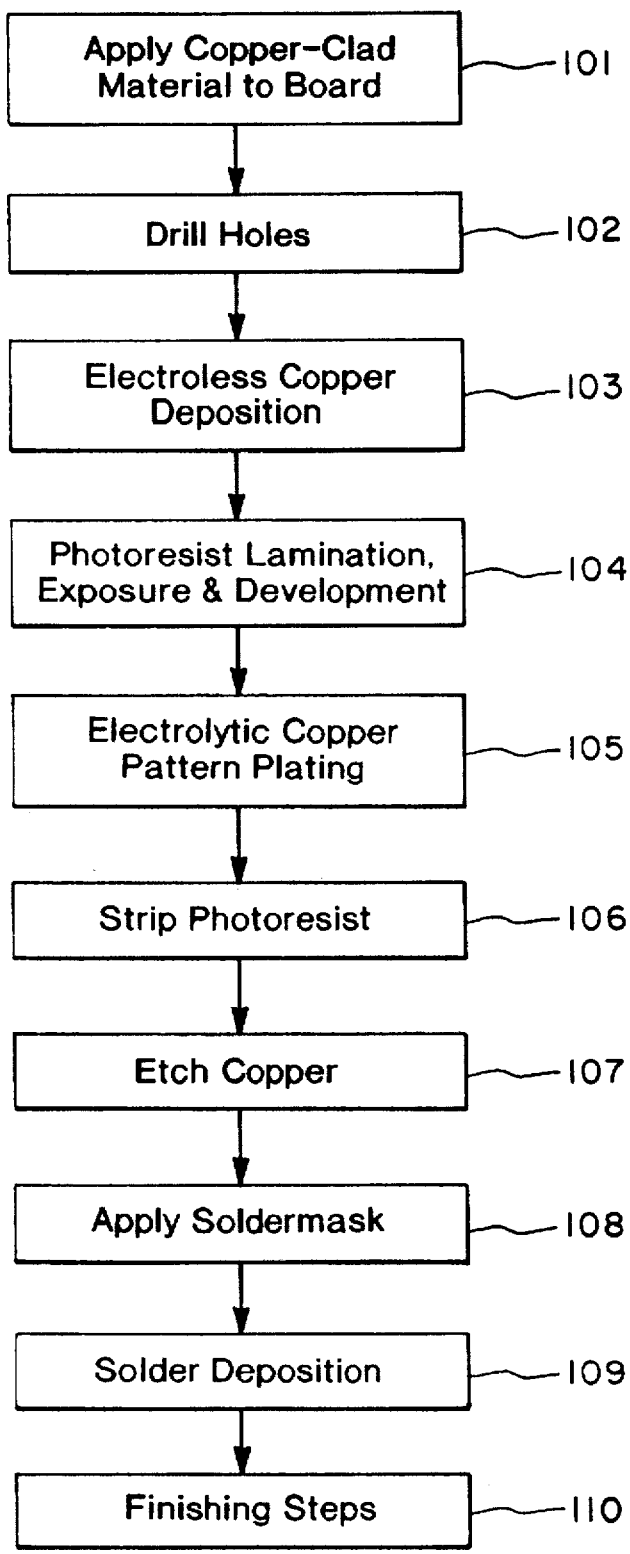
FIG. 1 is a flowchart of the present invention.
Figure 2:
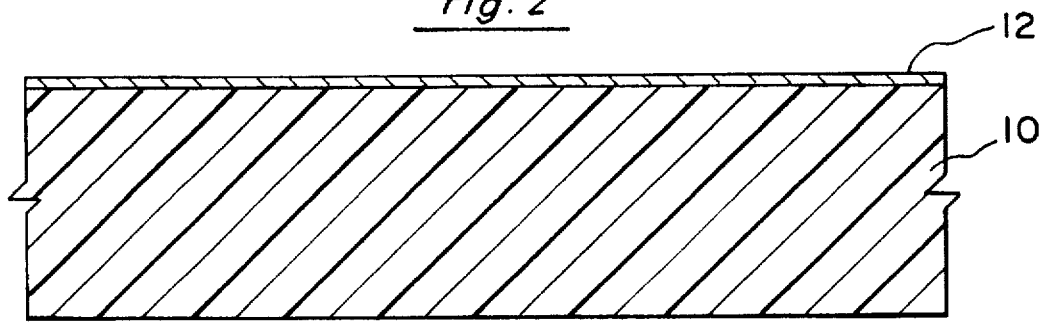
FIG. 2 is a cross-sectional view of a section of a printed circuit board 10 after it has been laminated with copper foil 12.

Turning to FIG. 1, a flowchart is provided for the present process. Beginning with step 101, a copper-clad material 12 is applied to the surface of the board 10 as shown in FIG. 2. Typically a copper foil is used having a thickness of approximately ¼ oz. per square foot or less.

As an alternative to step 101, the process can begin by bonding copper foil having a thickness of approximately ½ oz. per square foot to the surface of the board 10. The foil is then pre-etched to a thickness of approximately 0.00035 inches. The thicker foil helps to ensure a relatively uniform thickness over the entire board without holes or voids. The pre-etching step results in a copper layer that is generally equivalent to ¼ oz. copper foil. After completing either alternative for step 101, the remaining steps are the same, as will be described below.

Figure 3:
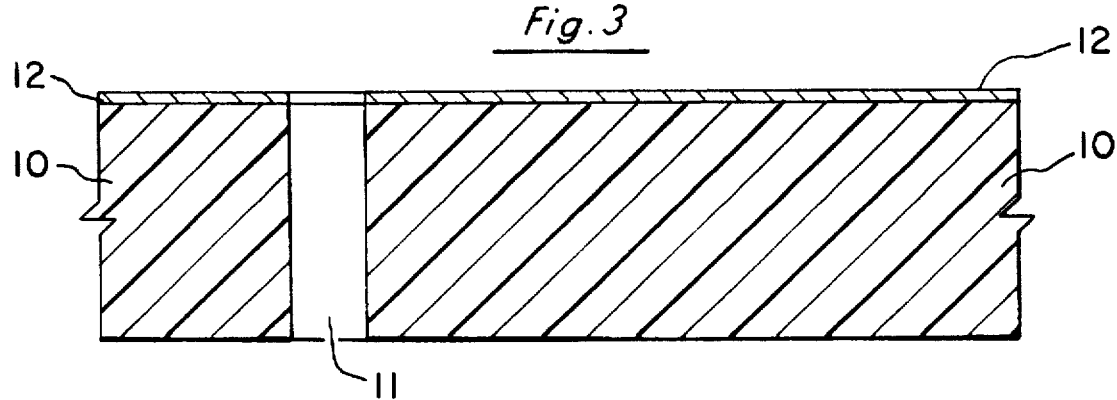
FIG. 3 is a cross-sectional view of the laminated printed circuit board 10 corresponding to FIG. 2 after through-holes 11 have been drilled.
Figure 4:
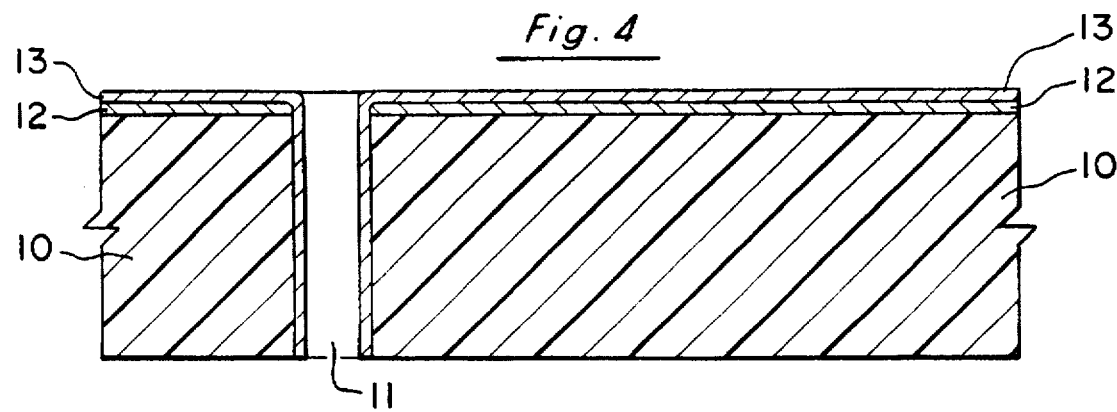
FIG. 4 is a cross-sectional view of the printed circuit board 10 corresponding to FIG. 3 after electroless deposition of a thin layer of copper 13.
Figure 5:
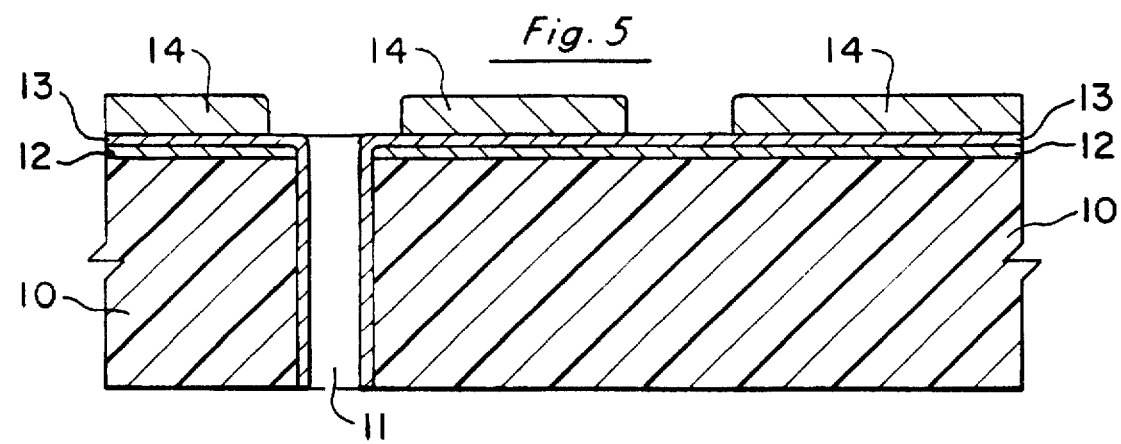
FIG. 5 is a cross-sectional view of the printed circuit board 10 corresponding to FIG. 4 after a photoresist layer 14 has been laminated, exposed, and developed.

At step 102, through-holes 11 are drilled to provide electrical connections from one side of the board 10 to the other side, or in the case of a multi-layer board, to provide electrical connections between layers. Drilling is done in the conventional manner and results in the board 10 as shown in FIG. 3. At step 103, a thin layer of copper 13 is deposited over the entire surface of the board 10 by electroless deposition a shown in FIG. 4. This step is necessary to create a conductive layer on the interior surfaces of the through-holes 11 for subsequent plating, as discussed below. It should be understood that steps 102 and 103 are optional and can be omitted unless conductive through-holes 11 are required. In either case, the combined thickness of the copper foil 12 and electroless copper 13 is very small relative to the thickness of the final trace.

Figure 6:
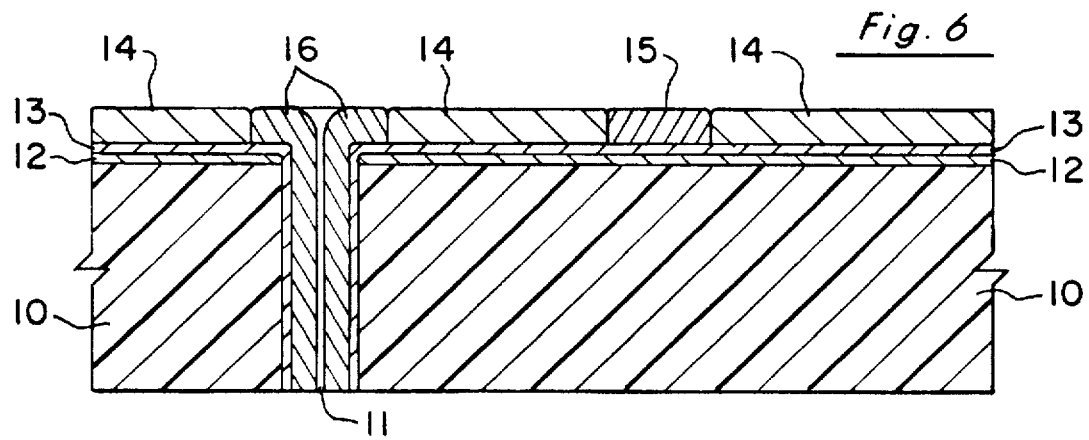
FIG. 6 is a cross-sectional view of the printed circuit board 10 corresponding to FIG. 5 after a layer of copper 15, 16 has been deposited on the exposed areas of the printed circuit board by electrolytic deposition to define traces.
Figure 7:
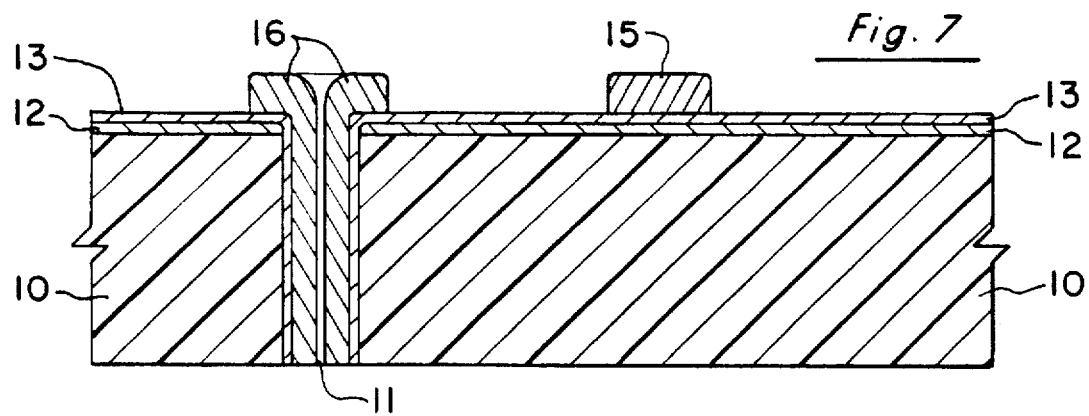
FIG. 7 is a cross-sectional view of the printed circuit board 10 corresponding to FIG. 6 after the photoresist layer 14 has been removed.

At step 104, the board is laminated with a photoresist layer 14, which is then exposed and developed in the conventional manner to define a negative mask for a desired pattern of signal traces on the board 10. In step 105, electrolytic copper pattern plating is used to deposit a relatively thick layer of copper 15, 16 on the exposed conductive surfaces of the board (as defined by the photoresist layer 14). In the case of signal traces, electrolytic plating deposits a thick horizontal layer of copper 15 over the exposed portions of the board. In the case of a through-hole 11, electrolytic plating deposits a thick layer of copper 16 extending through the hole 11 and also forms a collar about the opening of the through-hole 11 as shown in FIG. 6. The photoresist layer 14 is then removed in step 106, leaving the configuration shown in FIG. 7.

Figure 8:
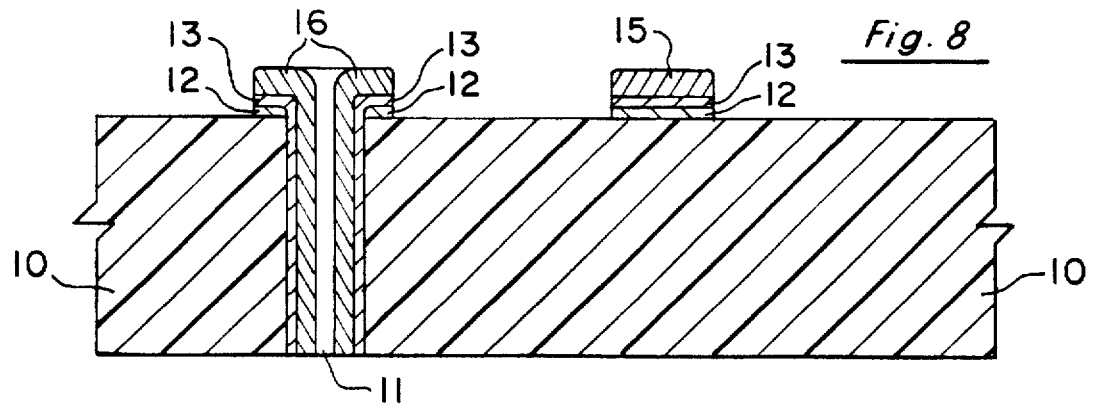
FIG. 8 is a cross-sectional view of the printed circuit board 10 corresponding to FIG. 7 after the copper etching step.

In step 107, the board is etched using a cupric chloride solution to remove copper from all exposed surfaces on the board. This is another point where the present process diverges from the conventional process by not applying a layer of a dissimilar metal (e.g., tin, tin-lead, or nickel-gold) prior to the etching step. The etchant slightly reduces the thickness of traces 15, 16 and rounds their corners as depicted in FIG. 8. However, due to the much greater thickness of the traces 15 and 16, the exposed copper in layers 12 and 13 will be completely removed by the etchant before the traces 15, 16 are significantly effected. Alternatively, an ammoniacal etchant could be substituted, although environmental costs are greater with these types of etchants.

Figure 9:
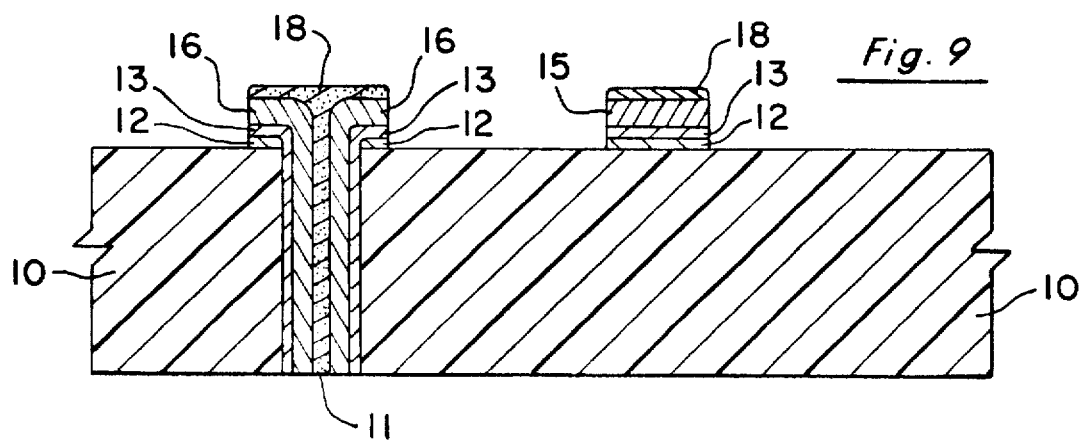
FIG. 9 is a cross-sectional view of the printed circuit board 10 corresponding to FIG. 8 after the solder layer 18 has been applied to the traces.

The board is then cleaned and a soldermask is applied in step 108. At step 109, a thin layer of solder 18 is deposited on selected areas of the traces and through-holes, as shown in FIG. 9 to facilitate external connects to the printed circuit board.

The finishing steps noted in step 110 complete the printed circuit board. For example, a legend is often imprinted on the board and cured. It may be necessary to apply nickel-gold tab plating for edge connectors on the board. Additional holes may be drilled and routing may be necessary. The board is also slotted, beveled, and cleaned before being delivered to the customer.

The above disclosure sets forth a number of embodiments of the present invention. Other arrangements or embodiments, not precisely set forth, could be practiced under the teachings of the present invention and as set forth in the following claims.

We claim:

1. A pattern plating method for fabricating printed circuit boards comprising:
    (a) bonding a thin first layer of copper to said board;
    (b) applying a photoresist layer over said first copper layer, and then selectively exposing and developing said photoresist layer to define a pattern of traces;
    (c) depositing a second layer of copper on said traces, said second copper layer being substantially thicker than said first copper layer;
    (d) removing said photoresist layer; and
    (e) etching said first copper layer and said second copper layer to substantially remove those portions of said first copper layer that are not covered by said second copper layer.

2. The method of claim 1 further comprising the following sequence of steps between steps (a) and (b):
    drilling holes through said board at selected locations; and
    depositing a thin layer of copper on said board including the surfaces of said holes by electroless deposition.

3. The method of claim 1 wherein said first copper layer is comprised of copper foil.

4. The method of claim 3 wherein said copper foil has a weight of approximately ¼ oz. per square foot or less.

5. The method of claim 3 wherein said copper foil has an initial weight of approximately ½ oz. per square foot, and said copper foil is etched to a thickness of approximately 0.00035 inches after being bonded to said board.

6. The method of claim 1 wherein said etching step employs an etchant solution comprising cupric chloride.

7. The method of claim 1 wherein a layer of solder is deposited on selected portions of said traces after said etching step.

8. The method of claim 1 wherein said second copper layer is deposited by electrolytic plating.

9. A pattern plating method for fabricating printed circuit boards comprising:

(a) bonding a thin first layer of copper foil to said board;

(b) applying a photoresist layer over said first copper layer, and then selectively exposing and developing said photoresist layer to define a pattern of traces;

(c) depositing a second layer of copper on said traces by electrolytic deposition, said second copper layer being substantially thicker than said first copper layer;

(d) removing said photoresist layer; and (e) etching said first copper layer and said second copper layer with a solution containing cupric chloride to substantially remove those portions of said first copper layer that are not covered by said second copper layer.

10. The method of claim 9 further comprising the following sequence of steps between steps (a) and (b):

drilling holes through said board at selected locations; and depositing a thin layer of copper on said board including the surfaces of said holes by electroless deposition.

11. The method of claim 9 wherein said copper foil has a weight of approximately ¼ oz. per square foot or less.

12. The method of claim 9 wherein said copper foil has an initial weight of approximately ½ oz. per square foot, and said copper foil is etched to a thickness of approximately 0.00035 inches after being bonded to said board.

13. The method of claim 9 wherein a layer of solder is deposited on selected portions of said traces after said etching step.

14. A pattern plating method for fabricating printed circuit boards comprising:

(a) bonding a thin layer of copper foil to said board;

(b) drilling holes through said board at selected locations;

(c) depositing a thin second layer of copper on said board including the surfaces of said holes by electroless deposition;

(d) applying a photoresist layer and then selectively exposing and developing said photoresist layer to define a pattern of traces on said board;

(e) depositing a third layer of copper on said traces by electrolytic deposition, said third copper layer being substantially thicker than said copper foil;

(f) removing said photoresist layer; and (g) etching with a solution containing cupric chloride to substantially remove those portions of said copper foil and said second copper layer that are not covered by said third copper layer.

15. The method of claim 14 wherein said copper foil has a weight of approximately ¼ oz. per square foot or less.

16. The method of claim 14 wherein said copper foil has an initial weight of approximately ½ oz. per square foot, and said copper foil is etched to a thickness of approximately 0.00035 inches after being bonded to said board.

17. The method of claim 14 wherein a layer of solder is deposited on selected portions of said traces after said etching step.

* * * * *